United States Patent [19]
Arkin et al.

[11] Patent Number: 6,073,263
[45] Date of Patent: Jun. 6, 2000

[54] PARALLEL PROCESSING PATTERN GENERATION SYSTEM FOR AN INTEGRATED CIRCUIT TESTER

[75] Inventors: Brian J. Arkin, Pleasanton; Garry C. Gillette, San Jose; David Scott, Fremont, all of Calif.

[73] Assignee: Credence Systems Corporation, Fremont, Calif.

[21] Appl. No.: 08/960,014

[22] Filed: Oct. 29, 1997

[51] Int. Cl.[7] .................................................. G01R 31/28
[52] U.S. Cl. .......................................... 714/738; 714/715
[58] Field of Search .................................... 714/738, 739, 714/715, 728

[56] References Cited

U.S. PATENT DOCUMENTS

| | | | |
|---|---|---|---|
| 4,905,183 | 2/1990 | Kawaguchi et al. | 364/900 |
| 5,432,797 | 7/1995 | Takano | 371/27 |
| 5,883,905 | 3/1999 | Eastburn | 371/27.1 |

*Primary Examiner*—Emmanuel L. Moise
*Assistant Examiner*—Esaw Abraham
*Attorney, Agent, or Firm*—Smith-Hill and Bedell

[57] ABSTRACT

A parallel processing pattern generation system for an integrated circuit tester includes two pattern memories, a main pattern generator, and two auxiliary pattern generators. Each pattern memory may receive and store data patterns from a host computer before the test. All three pattern generators may produce data pattern sequences in a variety of ways by executing separately stored algorithmic programs. The pattern sequences generated by each of the two auxiliary pattern generators separately address the two pattern memories so that either one or both of the two pattern memories may read out pattern data during a test. The main pattern generator includes a routing circuit for receiving as inputs a portion of the pattern data generated by the main pattern generator itself and the pattern data read out of the two pattern memories. The routing circuit, controlled by another portion of the pattern data produced by the main pattern generator, selects from among its inputs on a bit-by-bit, cycle-by-cycle basis to provide pattern data for controlling tester activities during each cycle of a test.

20 Claims, 7 Drawing Sheets

PARALLEL PROCESSING PATTERN GENERATION SYSTEM FOR AN INTEGRATED CIRCUIT TESTER

BACKGROUND OF THE INVENTION

1. Field of the Invention

The present invention relates in general to integrated circuit (IC) testers and in particular a parallel processing pattern generation system for an IC tester.

2. Description of Related Art

A typical per-pin integrated circuit tester includes a set of tester channels, one for each pin of an integrated circuit device under test (DUT). The tester organizes a test into a set of successive test cycles, and during each test cycle each channel carries out a test activity at a corresponding DUT pin. For example a tester channel may supply a test signal input to the DUT terminal or may monitor a DUT output signal at the terminal and produce an indicating "FAIL" signal when the DUT output signal does not behave as expected. The tester includes a pattern generator for supplying input data to each tester channel telling the tester channel what to do during each test cycle. The input data may also indicate expected states of DUT output signals during a test cycle.

Early pattern generators consisted primarily of a large addressable memory addressed by a counter. Each storage location of the memory contained all of the data needed for one cycle of the test and data for successive test cycles was stored at successive memory addresses. The counter incremented its output count for each successive test cycle so that the memory read out the appropriate pattern data for that cycle. As the size and complexity of integrated circuits increased, the required width and depth of the pattern memory became excessively large.

To reduce the amount of memory needed to store data defining a test, some integrated circuit testers were designed to store sequences of "vectors" referencing channel data patterns instead of channel data patterns themselves. As each vector is read out of memory it was decoded to produce the appropriate channel data pattern. This reduced the width, though not the depth, of the required pattern memory.

Some integrated circuit testers store algorithmic instructions for generating a vector sequence instead of the vector sequence itself. These testers include processors capable of executing those instructions to produce vector sequences during the test. In tests in which portions of a sequence of vectors are repetitive, an algorithm for generating such a vector sequence requires fewer memory storage locations than the vector sequence itself. However algorithmic vector sequence generation typically does not save much memory when the vector sequence to be generated is complex and non-repetitive. Also, the nature of the algorithm, and the nature of the processor needed to execute it, depend on the nature of the device being tested and on the nature of the test being performed. Thus, algorithmic pattern generators are typically designed with specific tests in mind and are not used in general purpose testers.

Thus the efficiency and ease with which an integrated circuit tester can be programmed to carry out a test depends largely on matching the type of pattern generator it employs to the nature of test it is being performed. A general purpose tester capable of efficiently carrying out a wide variety of integrated circuit tests has been elusive.

SUMMARY OF THE INVENTION

In accordance with one aspect of the invention, a parallel processing pattern generation system for an integrated circuit tester includes two pattern memories, a main pattern generator, and two auxiliary pattern generators. Each pattern memory may receive and store data patterns from a host computer before the test. All three pattern generators may produce data pattern sequences in a variety of ways by executing separately stored algorithmic programs. The pattern sequences generated by each of the two auxiliary pattern generators separately address the two pattern memories so that either one or both of the two pattern memories may read out pattern data during a test. A routing circuit receives as inputs a portion of the pattern data generated by the main pattern generator and the pattern data read out of the two pattern memories. The routing circuit, controlled by another portion of the pattern data produced by the main pattern generator, selects from among its inputs on a bit-by-bit, cycle-by-cycle basis to provide output pattern data for controlling tester activities.

Since each bit of output pattern data can be generated in any of a variety of ways from any of a variety of sources, the system can separately choose the most efficient method for generating each bit of output pattern data at any time during a test, thereby minimizing the amount of programming and pattern data that must be supplied to and stored by the pattern generator.

It is accordingly and object of the invention to provide a system for efficiently generating an output sequence of control data for an integrated circuit tester.

The concluding portion of this specification particularly points out and distinctly claims the subject matter of the present invention. However those skilled in the art will best understand both the organization and method of operation of the invention, together with further advantages and objects thereof, by reading the remaining portions of the specification in view of the accompanying drawing(s) wherein like reference characters refer to like elements.

DESCRIPTION OF THE PREFERRED EMBODIMENT(S)

Figure 1:
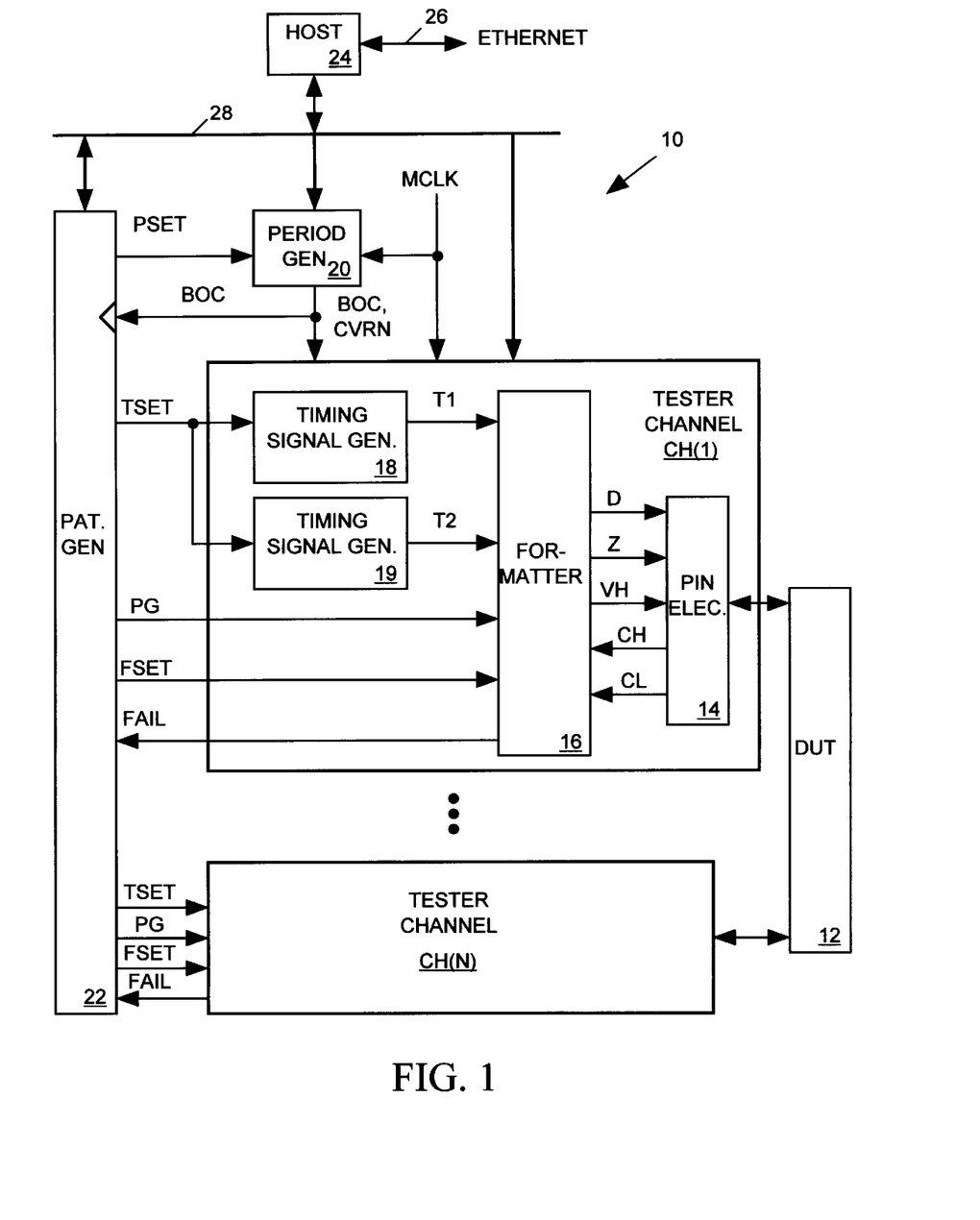
FIG. 1 illustrates an integrated circuit tester in accordance with the present invention.

FIG. 1 illustrates an integrated circuit tester 10 in accordance with the present invention for performing a test of an integrated circuit device under test (DUT) 12. Tester 10 includes a set of N tester channels CH(1)–CH(N), one for each pin or terminal of DUT 12. Tester 10 organizes a test into a set of successive test cycles and during each test cycle each channel CH(1)–CH(N) carries out a test activity at a corresponding DUT terminal. For example a tester channel may supply a test signal input to the DUT terminal or may monitor a DUT output signal at the terminal and produce an output FAIL signal when the DUT output signal does not behave as expected.

Tester 10 includes a pattern generation system 22 in accordance with the present invention which produces "format set" data (FSET), "timeset" data (TSET), "period set" data (PSET) and reference data (PG) for each test cycle. The FSET data references a particular drive or compare format the channel is to use during the test cycle. A "drive format" is a particular manner in which the channel controls the states of its output test signal during the test cycle. A drive format includes the manner in which the channel acquires data that determines successive test signal states during the test cycle and the manner in which the channel times test signal state changes. A "compare format" is a particular manner in which the channel determines whether the DUT output signal is behaving as expected during the test cycle. A compare format includes the manner in which the channel determines the expected states of the output signal and the manner in which the channel compares the output signal to its expected states and produces the FAIL signal. The TSET data indicates certain times during a test cycle at which an event is to occur, such as for example, a test signal state change or a DUT output signal comparison.

The PSET data, which indicates how long the test cycle is to last, is supplied to a period generator 20 at the start of each test cycle. Period generator 20 responds to the PSET data value by generating a reference signal BOC and a data value CVRN. The BOC signal tells each channel CH(1)–CH(N) that the next test cycle is to begin following a next pulse of a master clock signal MCLK. The CVRN data indicates how long after that next MCLK signal the next test cycle actually begins. The BOC signal also tells pattern generator 22 when to produce data for a next test cycle.

Each tester channel CH(1)–CH(N) includes a pin electronics circuit 14 for generating the test signal at the DUT in response to a set of drive control signals (D, Z and VH). The D control signal tells the pin electronics circuit 14 whether to drive its output test signal to a high or low logic level. The VH signal tells the pin electronic circuit whether to drive its output signal to a secondary voltage. The Z control signal tells the pin electronics circuit when to tristate the output test signal. During each test cycle the pin electronics circuit 14 also monitors the DUT output signal (if any) at the DUT terminal and produces compare high and compare low signals (CH and CL) indicating whether the DUT output signal is currently above a high logic level or below a low logic level.

In addition to pin electronics circuit 14, each tester channel CH(1)–CH(N) includes a formatter circuit 16 and two timing signal generators 18 and 19. Each timing signal generator 18 or 19 receives TSET data from pattern generator 20 and the BOIC and CVRN signals from period generator 20 at the start of each test cycle and pulses its output timing signal T1 or T2 once during each test cycle with a delay following the start of the test cycle indicated by the TSET data.

Formatter circuit 16 receives the FSET data from pattern generator 20 and supplies the drive control signals D, Z and VH to pin electronics circuit 14 causing it to carry out a drive format indicated by the FSET data. In some drive formats, the PG data indicates states to which the formatter is to set the drive control signals. The timing signals T1 and T2 tell formatter circuit 16 when to adjust states of drive control signals D, Z and VH during a test cycle. When the FSET data references a compare format, formatter circuit 16 samples the compare high CH and CL outputs of the pin electronics circuit at times indicated by the T1 and/or T2 timing signals and determines from the samples whether to assert the FAIL signal during the test cycle. In some compare formats the PG data references expected states of the CH and CL data. During the test, pattern generation system 22 also receives, stores and processes FAIL data produced by formatter circuit 16 in a manner described below.

To define a test to be performed, input data is supplied to a conventional host computer 24 via an Ethernet bus 26. Host computer 24 distributes the data via a conventional computer bus 28 to various control registers and memories within formatter circuit 16, pattern generation system 22, period generator 20, timing generators 18 and 19, and pin electronics circuits 14. As described below, the data supplied to pattern generation system 22 tells the pattern generator how to produce its output pattern of PSET, TSET, FSET and PG data for each test cycle. The data from host 24 also tells pattern generation system 22 how to process the FAIL data signals returned by the tester channels. The data supplied to period generator 20 relates a cycle period length to each possible value of PSET. The data supplied to timing generators 18 and 19 relates a particular T1 and T2 timing signal pulse delay to each possible value of TSET. Data host computer 24 supplies data to pin electronics circuit 14 indicating various parameters of DUT 12 including high and low test signal and output signal comparison logic levels. Data supplied to the formatter 16 of each channel relates particular drive and control formats to each possible value of FSET data.

Pattern Generation System

Figure 2:
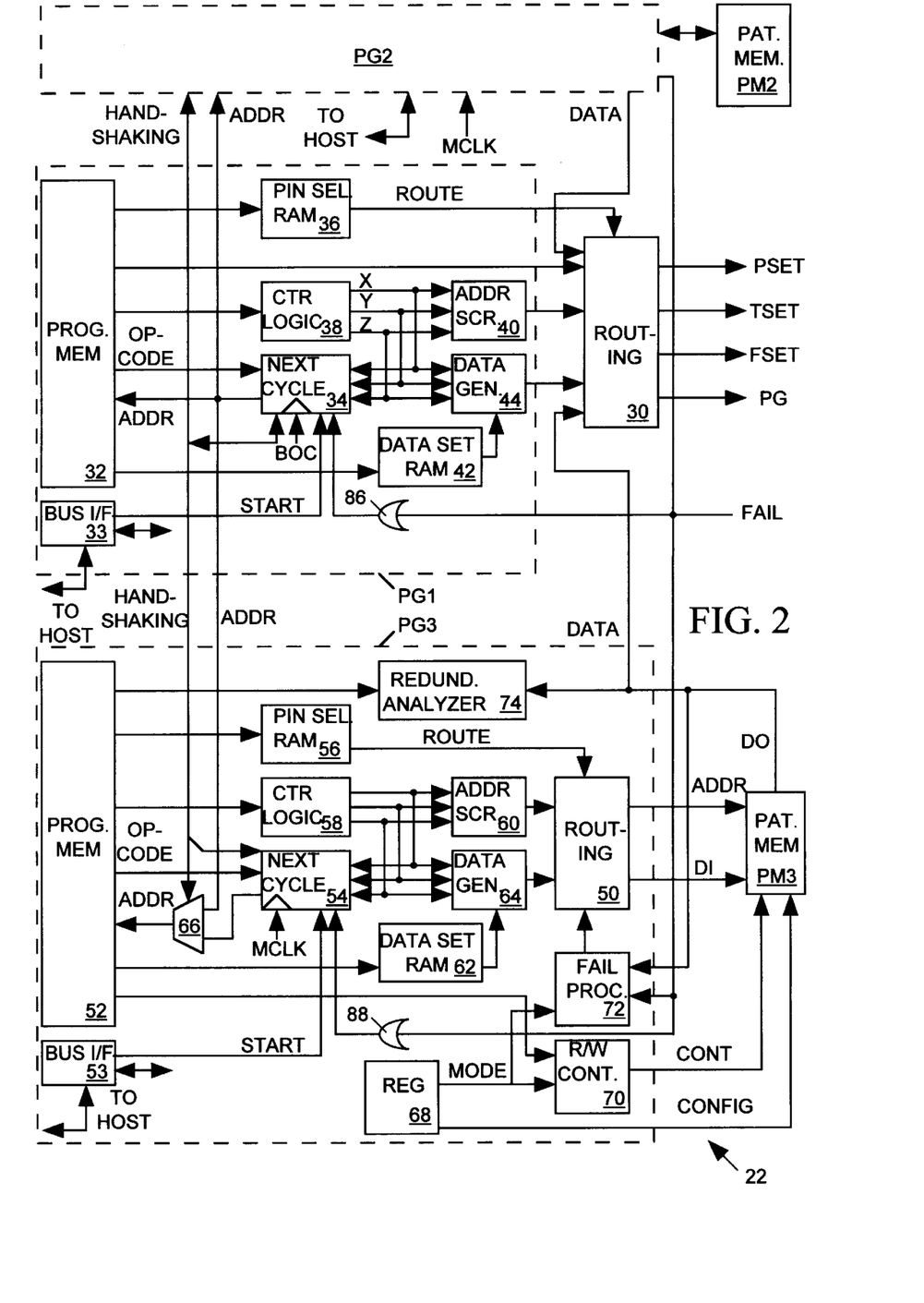
FIG. 2 illustrates the pattern generation system of FIG. 1 in more detailed block diagram form.

FIG. 2 illustrates the pattern generation system 22 of FIG. 1 in more detailed block diagram form. Assuming, for example, that TSET and FSET are four bits each, and PG is two bits, then pattern generation system 22 generates 10 bits of TSET, FSET and PG data for each channel, for each cycle of the test. Pattern generation system 22 must also generate, for example, 4 bits of PSET data for each test cycle. If the test has, for example 48 channels, then pattern generation system 22 must generate 484 bits of pattern data for each test cycle. Since a test may span millions of test cycles, the amount of pattern data pattern generation system 22 must provide during a test can be quite large.

Before a test begins, host computer 24 of FIG. 1 provides pattern generation system 22 with programs and data defining the test pattern to be generated. For some tests, host computer 24 may simply write the necessary pattern data sequences into a pattern memory within pattern generation system 22 and program pattern generation system 22 to sequentially read the data out of the pattern memory and supply it to the tester channels. However as the number of test cycles increases, the pattern memory depth becomes a limiting factor. Also, even when pattern generation system 22 has sufficient pattern memory to directly store all pattern data that it is to generate, the amount of time host computer 24 requires to write massive amounts of data into a pattern memory can be large.

To reduce the amount of pattern data the host computer 24 must send to pattern generation system 22, the pattern generation system includes the capability of algorithmically generating pattern data, rather than simply reading it out of memory. Where pattern data to be supplied to tester channels is repetitive, the host computer 24 can quickly send pattern generation system 22 a relatively small algorithm that will tell system 22 how to generate a relatively large amount of pattern data.

The manner in which pattern generation system 22 produces output pattern data can be separately selected for each channel depending on the nature of the data. In a typical integrated circuit test, some tester channels perform repetitive tasks requiring repetitive input data patterns that can be easily defined by an algorithm. Pattern generation system 22 can algorithmically generate such data patterns in any of a variety of ways in response to such an algorithm. In the same IC test, other tester channels may perform less repetitive tasks requiring relatively random data patterns which cannot be easily generated by an algorithm. Pattern generation system 22 generates these data patterns by reading them out of pattern memory. The various methods for generating pattern data can be used concurrently to separately provide data for each of the tester channels such that the most appropriate pattern generation method can be employed for each tester channel.

As shown in FIG. 2, pattern generation system 22 includes a master pattern generator PG1, two auxiliary pattern generators PG2 and PG3 and two pattern memories, PM2 and PM3. Since pattern generator PG2 is internally identical to PG3, only pattern generators PG1 and PG3 are illustrated in detail. All three pattern generators PG1–PG3 can generate patterns algorithmically by executing stored programs. Auxiliary pattern generators PG2 and PG3 use their data pattern outputs to address pattern memories PM2 and PM3, respectively. Thus, for example, after the host computer 24 loads pattern memory PM3 with pattern data, pattern generator PG3 can send an address to pattern memory PM3 for each test cycle causing the pattern memory to read out the addressed pattern data. Since the auxiliary pattern generators PG2 and PG3 generate pattern memory addresses algorithmically, they can be programmed to read pattern data out of the pattern memories in any desired order and can repeatedly read access various pattern data sequences stored in PM2 or PM3 by performing loops, subroutines and the like. Pattern data read out of pattern memory PM2 or PM3 may be forwarded to the tester channels.

While auxiliary pattern generators PG2 and PG3 use their output pattern data to address pattern memories PM2 and PM3, main pattern generator PG1 uses its output pattern data for other purposes. Some of the pattern data produced by main pattern generator PG1 is used as routing control data to control a routing circuit 30. Routing circuit 30 includes input terminals for receiving pattern data read out of pattern memories PM2 and PM3 and for receiving pattern data algorithmically generated by the main pattern generator PG1. Routing circuit 30 also includes output terminals for delivering selected bits of its input pattern data to tester channels CH(1-CH(N) and period generator 20 of FIG. 1 as the PSET, TSET, FSET and PG data. Routing circuit 30, which may be implemented for example by multiplexers or a crosspoint switch, can route a data bit arriving at any of its input terminals to any one or more of its output terminals. Thus routing circuit 30 can flexibly route data to the tester channels so that, for example, pattern data read out of pattern memory PM3 can be supplied to some tester channels while pattern data algorithmically generated by PG1 is supplied to other tester channels.

Main pattern generator PG1 includes a program memory 32 for storing a pattern generation algorithm. A "next cycle" circuit 34, clocked by the BOC output signal of period generator 20 of FIG. 1, addresses program memory 32. Next cycle circuit 34 is similar to a conventional microprocessor and is capable of executing branches, jumps, calls and similar instructions. When setting up the tester to perform a test, host computer 24 of FIG. 1 writes program instructions into PG1 program memory 34 via a conventional bus interface circuit 33. (As discussed in more detail below, host computer 24 also supplies control data to and communicates with various other components of PG1 via bus interface circuit 33.) After supplying programming and control data to pattern generator PG1, host computer 24 transmits a START signal to next cycle circuit 34 via bus interface circuit 33. Thereafter, on each pulse of the BOC signal, next cycle circuit 34 sends an address (ADDR) to program memory 32. When addressed, program memory 32 returns an instruction opcode to next cycle circuit 34 which tells next cycle circuit 34 how to address program 32 after the next BOC signal pulse.

When addressed, program memory 32 also reads out instruction operand bits to various other PG1 circuits. Some of the operand bits address a "pin selection RAM" 36 which acts as a decoder to provide routing control data (ROUTE) to routing circuit 30. The host computer 24 of FIG. 1 writes routing control data to each address of pin selection RAM 36 so that routing circuit 30 can provide each of the data routing configurations that will be needed for the test. Other operand bits read out of program memory 32 provide pattern data input to routing circuit 30. Additional operand bits read out of program memory 32 control a set of three counters included in a counter logic circuit 38. The operands can make each counter increment, decrement or preset its count. The three output counts are supplied to next cycle circuit 34. Some of the opcodes supplied to next cycle circuit 34 tell it to branch when a selected one of the output counts reaches a particular value.

The three counter outputs of counter logic circuit 38 are also supplied to an "address scrambler" circuit 40 including an internal RAM acting as a lookup table to convert output count values of counter logic circuit 38 to pattern data supplied as an additional inputs to routing circuit 30. Host computer 24 writes data into the address scrambler 40 RAM via bus interface circuit 33 before the test to establish relationships between input count values from counter logic circuit 38 and output pattern data that are appropriate for the test to be performed. Address scrambler 40 can be used, for example, to scramble a logical address to a DUT physical address.

Other operand bits produced by PG1 program memory 32 address a "data set" RAM 42 acting as a decoder to convert the operand into data controlling the manner in which a conventional data generator 44 processes the output counts of the counter logic. Data generator 44 includes an arithmetic logic unit for processing the output counts of counter logic circuit 38 in any of a variety of ways depending on its control data input from data set RAM 42. Data generator 44 can be used to generate repetitive data patterns. Host computer 24 writes data into data set RAM 42 before the test to allow the operand to select from among a set of data generator 44 processing operations that are appropriate for the test to be performed.

The address scrambler 40, data generator 44 and program memory 32 of PG1 all provide pattern data inputs to routing circuit 30 in addition to the pattern data that may be read out of pattern memories PM2 and PM3. During each cycle of the test routing circuit 30 selects the source of each of its output bits from among all of its inputs in response to the routing control data (ROUTE) produced by pin select RAM 36. With regard to the programming effort or amount of pattern data required to make pattern generation system 22 produce a desired output pattern, the most efficient pattern generation source for each PSET, TSET, FSET or PG output sequence depends on the nature of the output sequence. Data set generator 44 and address scrambler 40 are the most efficient sources for highly repetitive patterns. Pattern memories PM2 or PM3 are the best sources for sequences that are more random in nature.

Auxiliary pattern generators PG2 and PG3 are similar in nature and are interconnected with the main pattern generator PG1 in similar manners. As shown in FIG. 2, auxiliary pattern generator PG3 has all of the components of the main pattern generator PG1 including a routing circuit 50, a program memory 52, a bus interface circuit 53, a next cycle circuit 54, and pin select RAM 56, counter logic 58, an address scrambler 60, a data set RAM 62, and a data generator 64. These components operate in the same manner as similar components of PG1 to produce pattern data in a variety of ways. The output of a routing circuit 50 drives address (ADDR) and data input (DI) terminals of pattern memory PM3. Auxiliary pattern generator PG3 also includes a multiplexer 66 controlled by a signal from next cycle circuit 34 of PG1, for selecting either the address output of next cycle generator 34 of PG1 or the address output of next cycle generator 54 as the address input to program memory 52.

In lieu of storing pattern data, pattern memory PM3 (or PM2) can be used for storing the FAIL data outputs of tester channels CH(1)–CH(N). Before starting a test host computer 24 of FIG. 1 writes MODE data into a register 68 indicting whether data is to be read out of or written into pattern memory PM3 during the test. The MODE data is supplied as input to a conventional read/write memory control circuit 70 which handles read and write access to pattern memory PM3 in response to an operand bit from program memory 52. Auxiliary pattern generator PG3 also includes "fail processor" 72. Fail processor 72 is instructed by a part of the MODE stored in register 68 to order the returned FAIL data in a particular manner when forwarding the FAIL data to routing circuit 50. When the reordered FAIL data is to be stored in pattern memory PM3, routing circuit 50 routes it to the pattern memory's data input terminals. A "redundancy analyzer" circuit 74, as described below, is provided to analyze the FAIL data after it is stored in pattern memory PM3 and to forward the results of its analysis to the host computer 24 via bus interface circuit 53.

While pattern memory PM3 can store a fixed number of data bits, data CONFIG stored in register 68 configures pattern memory PM3 for a word length that matches the width of the data the pattern memory is to produce during each test cycle. For example given that pattern memory PM3 is capable of storing N*M data bits, the CONFIG data can configure it to store M N-bit words, 2M N/2-bit words, N M-bit words, etc. As the number of bits a pattern memory must provide during a test cycle decreases, the length of the pattern data sequence it stores increases. Pattern memory PM2 is similarly configurable.

The auxiliary pattern generators PG2 and PG3 can be programmed to operate together or independently in a variety of test modes, examples of which are described below.

Data Buffer Memory Mode

Figure 3:
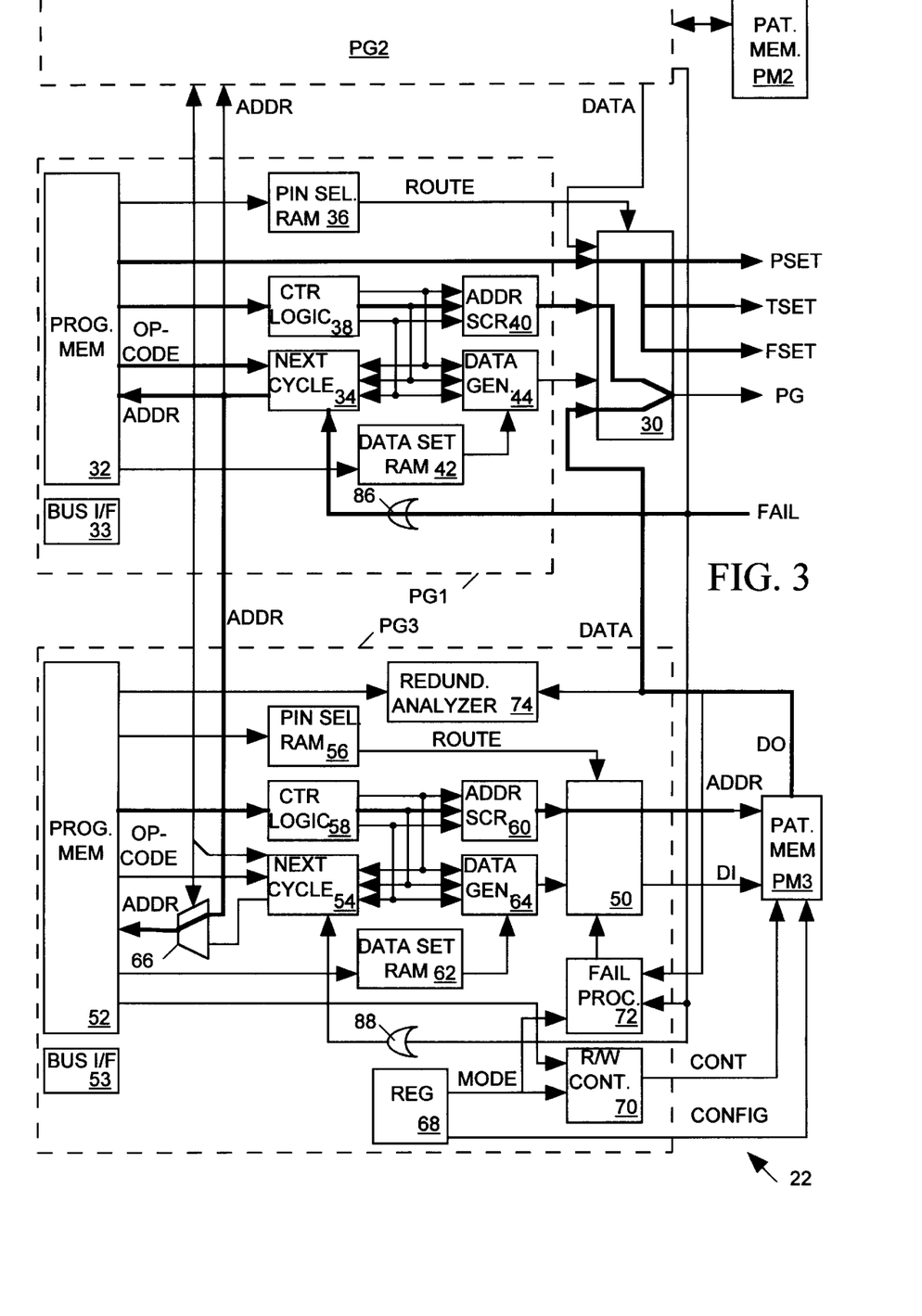
FIGS. 3–6 illustrate data flow in the pattern generation system of FIG. 2 for various modes of operation.

FIG. 3 illustrates a "data buffer memory" mode. Bold lines highlight major data flow paths. In the data buffer mode, pattern memory PM3 holds some of the pattern data that is to be sent to a device under test, while another portion of that pattern data is generated by the main pattern generator PG1. Main pattern generator PG1 controls the addressing of the auxiliary pattern generator's program memory.

The data buffer mode is useful, for example, in testing a PROM to determine if it reads out the correct data from each of its addressable storage locations. During the test, the PROM is sequentially addressed and the resulting PROM output bits are compared to their expected values to determine if the PROM is working properly. Since the sequence of operations carried out by each tester channel is highly repetitive, the sequences of TSET and FSET data can be provided as a sequence of operands in a repeatable subroutine of the algorithm stored in program memory 32 of main pattern generator PG1. The PSET data can be provided in a similar manner. Routing circuit 30 routes the PSET, TSET and FSET outputs of program memory 32 directly to the tester channels.

Some of the tester channels drive address terminals of the PROM under test. Each of these channels receives a sequence of PG data bits indicating the state of an address signal it is to generate during each test cycle. Address scrambler 40 of main pattern generator PG1 receives a count output of counter logic 38 and can convert the count to a sequence of addresses. Since the PROM address is progressively incremented through the test, address scrambler 40 is a good choice for generating the PG data bits for the channels that receive the address.

The sequence of PG data supplied to the tester channels monitoring the data read out of the PROM under test indicates data expected to be stored in successive PROM addresses. Since the sequence of data read out of the PROM under test as the PROM is sequentially addressed is typically random and not easily generated by an algorithm, it is best to use pattern memory PM3 to store the expected data. In particular, for each address in the PROM under test there is a corresponding address in pattern memory PM3 to which the host computer writes the data we expect to see at the corresponding PROM address. The host computer then programs program memory 52 and address scrambler 60 of auxiliary pattern generator PG3 in substantially the same way it programs program memory 32 and address scrambler 40 of main pattern generator PG1, with multiplexer 66 of PG3 set to select the address output of next cycle circuit 34 as the address input to program memory 52.

Thereafter, during the test, address scrambler 40 produces a sequence of PROM addresses on the PG lines leading to tester channels driving the ROM address terminals and so that the PG1 data generator produces an appropriate sequence of PSET, TSET and FSET data for the tester channels. At the same time address scrambler 60 addresses a corresponding storage location of the pattern memory PM3. Routing circuit 30 delivers the expect data output of the pattern memory PM3 as PG input to the tester channels that monitor the PROM data output terminals. These tester channels compare the data read out of the pattern memory PM3 to the data read out of the PROM to determine whether the PROM is producing the expected output. When a tester channel detects an incorrect ROM data output bit, the channel asserts one of the FAIL lines. An OR gate 86 in main pattern generator PG1 ORs the FAIL signals from the various channels to produce an interrupt to the next cycle circuit 34 causing it to execute an interrupt routine. The interrupt routine tells the next cycle circuit 34 to abort the test and to signal the host computer via bus interface 33.

Thus in the data buffer memory mode, pattern memory is used only for storing the expect data that is supplied to tester channels monitoring the PROM output. All other pattern data supplied to the tester channels is algorithmically generated.

Error Capture Mode

Figure 4:
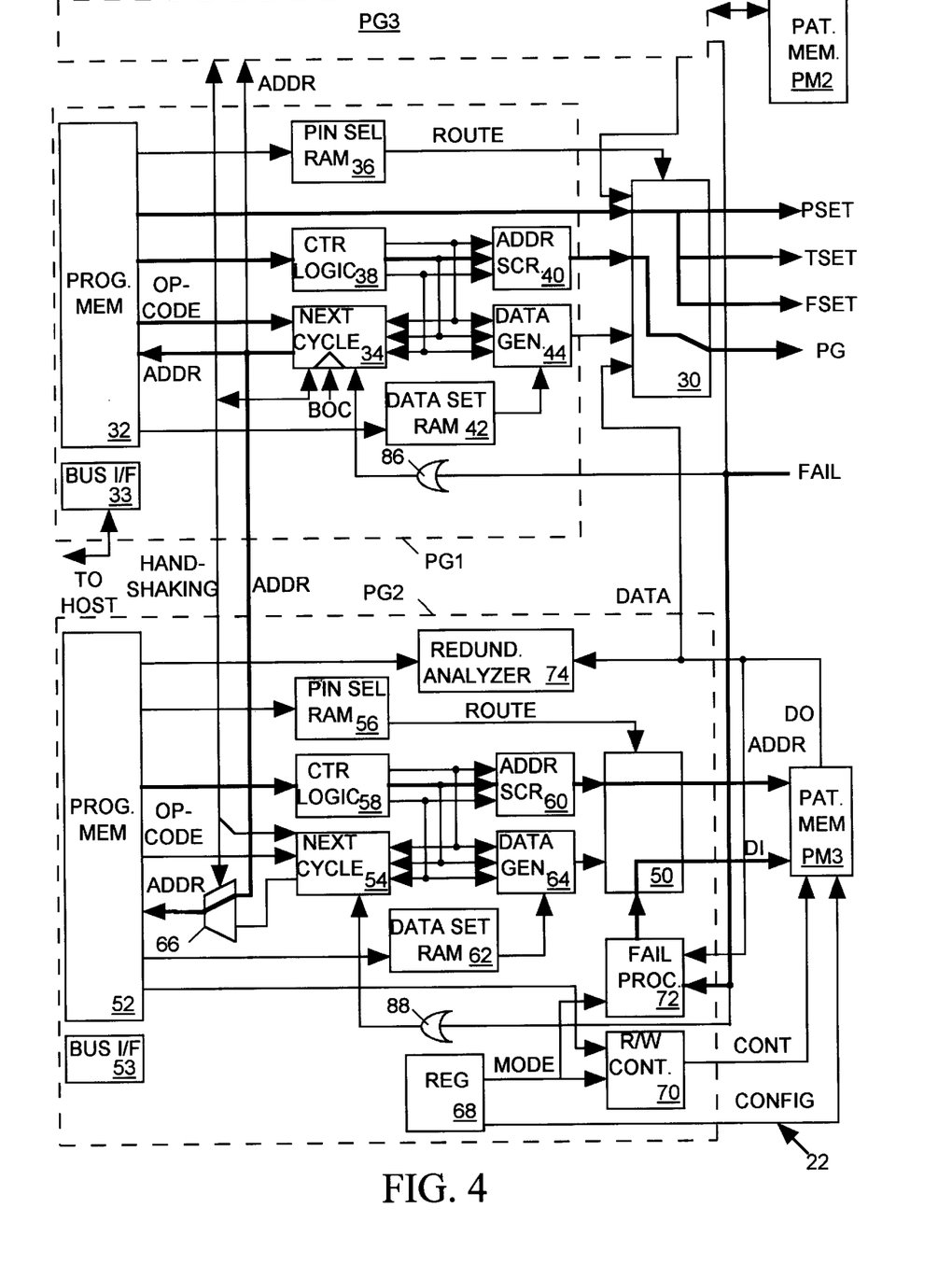

FIG. 4 highlights major address and data flow paths for an "error capture" mode of tester operation. This mode is useful, for example, in testing a RAM DUT to determine if each storage location correctly stores and reads out all of its bits. In this mode the tester writes a logical "1" bit to each bit position of each RAM DUT address and then reads it back out of the RAM to see if the bit is still a "1". The test then repeats the operation by writing a logical "0" to each RAM bit position and reading it back out. Each data output channel asserts its FAIL signal output if the data read out is not as expected. The FAIL bits produced by those channels are sent to fail processor 72. For each address in the RAM under test there is a corresponding storage location in pattern memory PM3 that is used to store test results. Initially each bit in pattern memory PM3 is set to a "0". During either the first or second pass, as the data is read out of an address of the RAM under test, fail processor 72 reads the data out of the corresponding address of pattern memory PM3. If any tester channel monitoring a data output bit of the RAM under test returns a FAIL signal, fail processor 72 sets a logical "1" into a corresponding bit position of the data read out of pattern memory PM3 and then writes the resulting data back into that pattern memory address. The MODE data from register 68 tells fail processor 72 how to map FAIL signals to pattern memory bit positions. Thus at the end of the test, pattern memory PM3 contains a map of faulty memory cells of the RAM under test.

To implement the error capture mode, host computer 24 of FIG. 1 programs pattern generator PG1 so that so during the test, program memory 32 supplies the PSET, TSET and FSET data to the all channels and so that address scrambler 40 provides PG address data to the channels driving the RAM device under test address terminals. Multiplexer 66 addresses program memory 52 with the ADDR output of next cycle circuit 34. Address scrambler 60 is configured so that whenever address scrambler 40 addresses a storage location of the RAM under test, address scrambler 60 addresses the corresponding storage location of pattern memory PM3. Operands in program memory 52 signal read/write controller 70 to implement the necessary read/ modify/write operations. Since the FSET data supplied to the tester channels accessing the RAM's data input/output terminals can indicate the "1" or "0" state of the RAM data input or expected RAM data output, PG data for that channel is not needed.

Thus in this example of an error capture mode test, the main pattern generator PG1 algorithmically generates all of the pattern data supplied to the tester channels. Pattern memory PM3 is used only for storing test results.

Redundancy Analysis

Figure 5:
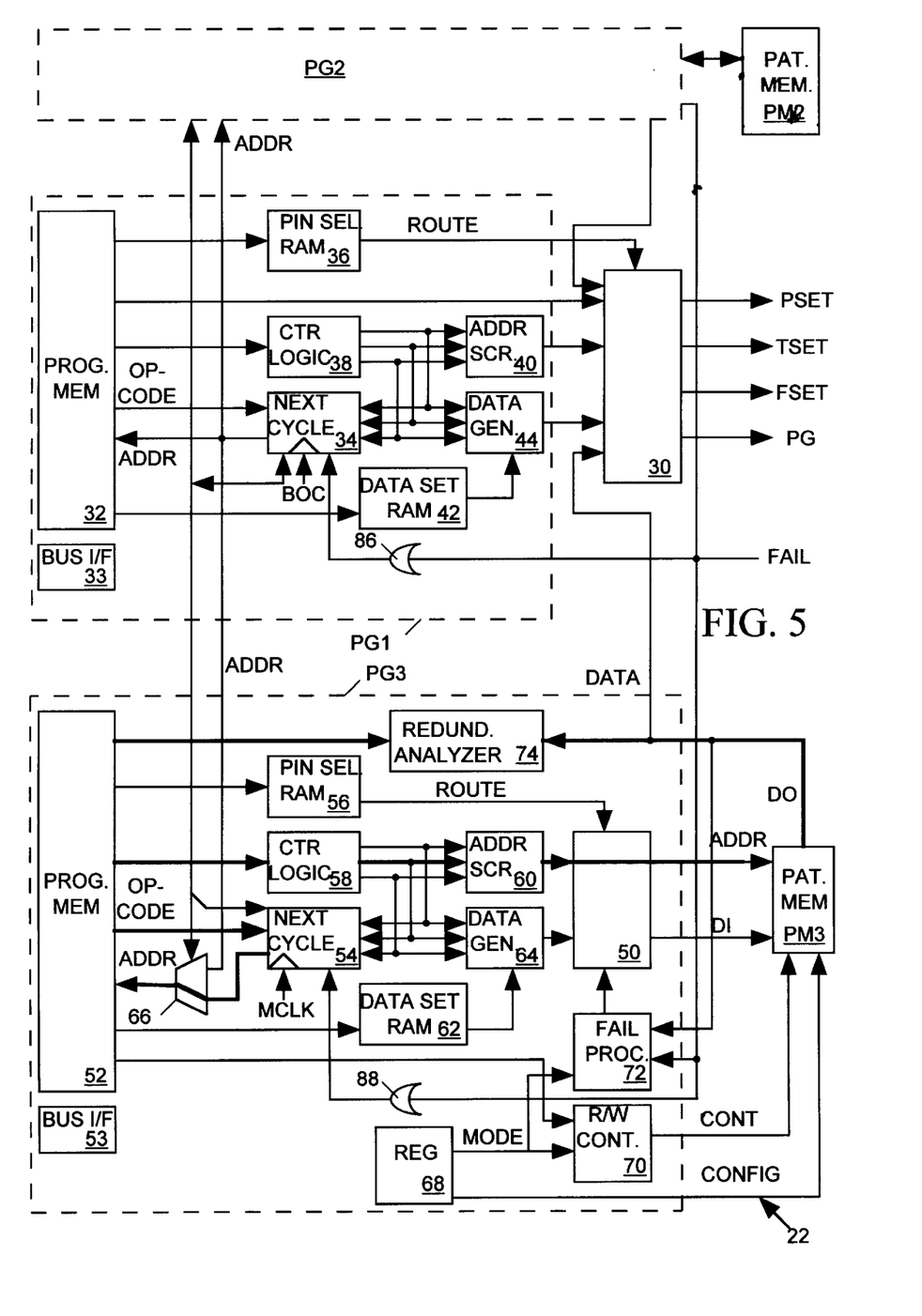

FIG. 5 highlights major address and data flow paths for a redundancy analysis mode of tester operation. Some RAMs are manufactured with one or more spare rows and/or columns of memory cells in addition to a normal set of rows and columns. Such a RAM can be permanently programmed to use a spare row or column when one of the normal rows or columns is defective. The previously discussed error capture mode test can be used to generate in pattern memory PM3 a map of the RAM under test, each bit in the map indicating whether a corresponding memory cell of the RAM under test is defective.

In the redundancy analysis mode, multiplexer 66 is set to allow next cycle circuit 54 to address program memory 52. Address scrambler 60 sequentially addresses pattern memory PM3. Redundancy analyzer 74 obtains the map data read out of pattern memory PM3, counts the number of failed bits in each column and row of the RAM, and then signals the host computer to read the results out of the registers via bus interface circuit 53.

Parallel Vector Mode

Figure 6:
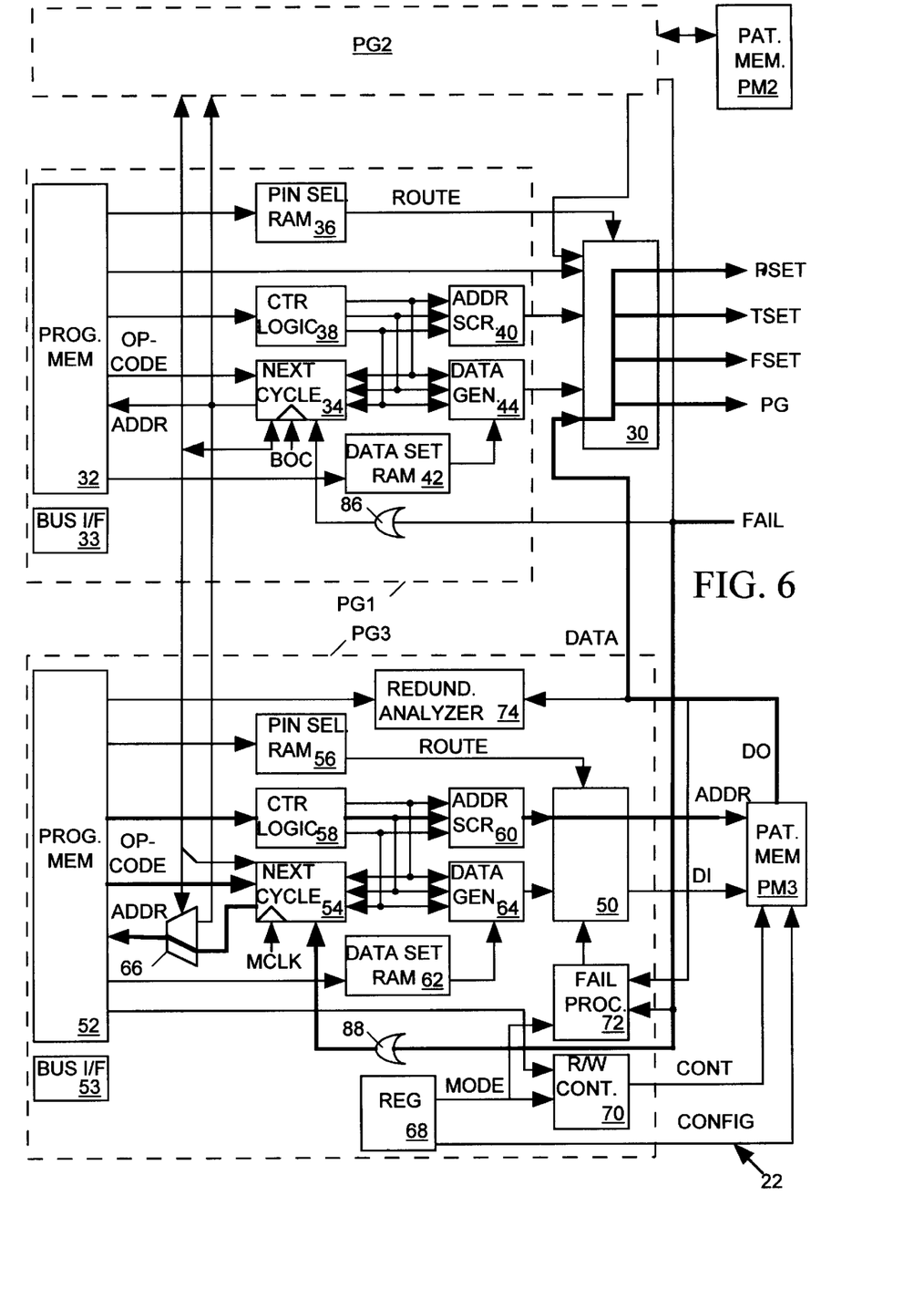

FIG. 6 highlights major address and data flow paths for a "parallel vector" mode of tester operation. This mode is particularly useful for testing control logic inside memory devices in which timing control, format control and data is needed in the form of a large sequence of random vectors. To implement this mode the host stores a sequence of test vectors in pattern memory PM3. Each test vector includes all of the PG, PSET, TSET and FSET data needed by all tester channels for one cycle of the test. The PG3 address scrambler 60 addresses pattern memory PM3 and next cycle circuit 54 addresses the program memory 52. During the test pattern memory PM3 reads out a sequence of test vectors and the PG1 routing circuit 30 routes bits of those vectors to the appropriate tester channels. When a channel detects a DUT output failure, it asserts one of the FAIL signals. An OR gate 88 ORs the FAIL signals to produce an interrupt input to next cycle circuit 54, causing it execute an interrupt handler. The interrupt handler may, for example, cause pattern generator PG3 to abort the test and signal the host via the bus interface circuit 53.

Thus in the parallel vector mode of operation, all of the pattern data supplied to the device under test is obtained from the pattern memory PM3 and none of that data is algorithmically generated.

Mixed Modes

Pattern generators PG1–PG3 can carry out different aspects of a test concurrently. For example, for a parallel vector mode test requiring more pattern data than can be stored in either pattern memory PM2 or PM3, the pattern data can be allocated to both pattern memories. In such case, the main pattern generator PG1 could be programmed to switch routing circuit 30 to route data from pattern memories PM2 and PM3 to the tester channels at different times during the test.

It is also possible to program auxiliary pattern generators PG2 and PG3 to alternate between modes, for example between the error capture and redundancy analysis modes. For example when sequentially testing a set of DUT's A, B and C, pattern generator PG2 could be programmed to first operate in the error capture mode to collect failure data from DUT A and to thereafter operate in the redundancy analysis mode to analyze the results for that DUT. Pattern generator PG3 could be programmed to operate in the same manner but out of sync with PG2 so that, for example, while PG2 is capturing test data from DUT B, PG3 can be analyzing data it previously captured from DUT A. Thereafter while PG3 is capturing data from a DUT C, PG2 can be busy analyzing the data it captured from DUT B.

As another example of mixed mode operation, PG3 may be programmed to operate in parallel vector or data buffer mode to provide a data pattern to a DUT while PG2 may be programmed to operate in an error capture mode to collect and store fail results.

Redundancy Analyzer

Figure 7:
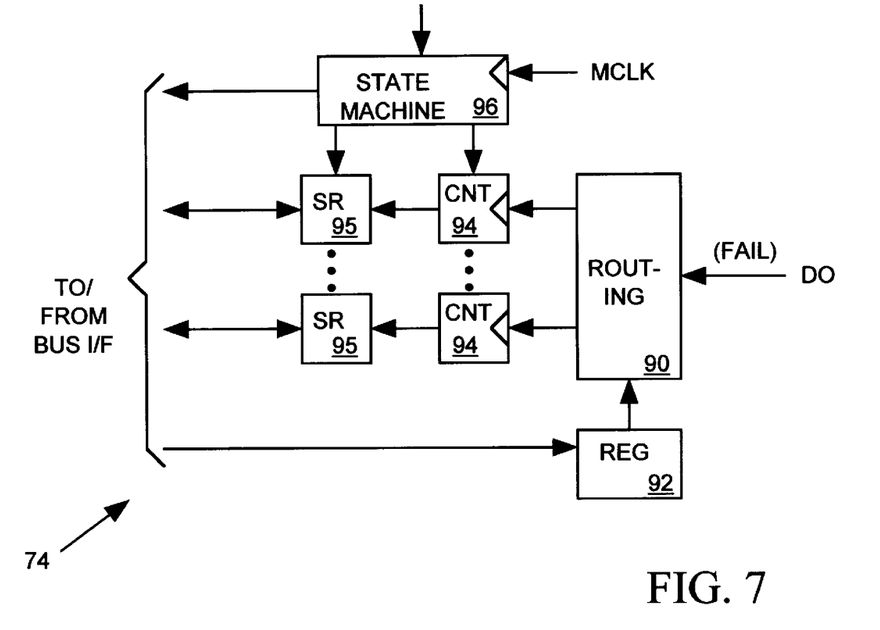
FIG. 7 illustrates the redundancy analyzer of FIG. 2 in more detailed block diagram form.

FIG. 7 illustrates redundancy analyzer 74 of FIG. 2 in more detailed block diagram form. Redundancy analyzer 74 may be used to provide a count of memory cell failures along each row or column of a memory DUT. At the end of a memory test, the fail data in the pattern memory mimics the fail pattern in the memory DUT. Redundancy analyzer 74 includes a routing circuit 90 under control of routing data that host computer 24 of FIG. 1 writes to a register 92 via bus interface circuit 53 of FIG. 2. Routing circuit 90 routes each bit of the stored FAIL data read out of pattern memory PM3 to a clock input of a separate one of a set of counters 94 which may be reset by a state machine 96. An operand from program memory 52 initially tells state machine 96 to reset counters 94. If the FAIL data bit input to a counter 94 is true, indicating a failed memory cell in the DUT, the counter increments its output when clocked. If the FAIL data bit input to a counter 94 is false, the counter does not increment its output. After counters 94 are clocked with FAIL data for a set of DUT rows or columns, state machine 98 shifts the counter 94 outputs into a set of shift registers 95 and resets counters 94. Thereafter, counters 94 may be clocked with FAIL data for another set of DUT rows or columns and the result shifted into registers 95. When FAIL counts for all rows and columns of the DUT have been shifted into registers 95, state machine 96 signals the host computer via bus interface 53 of FIG. 2 and the host records the data in shift registers 95.

Address Scrambler

Figure 8:
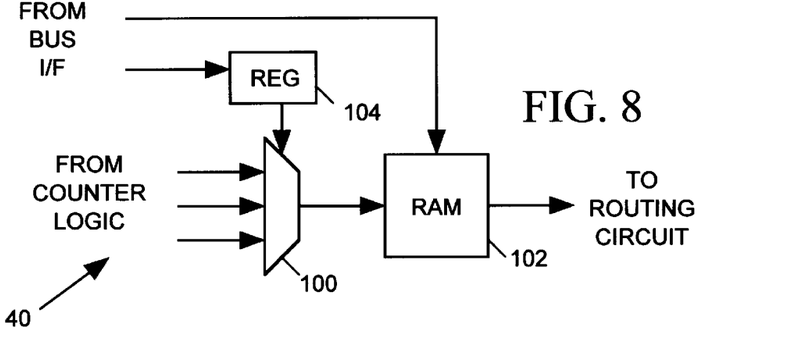
FIG. 8 illustrates the address scrambler of FIG. 2 in more detailed block diagram form.

FIG. 8 illustrates the address scrambler 40 of FIG. 2 in more detailed block diagram form. (Address scrambler 60 of FIG. 2 is similar.) The address scrambler is used to translate topological difference between logical addresses presented to the DUT and any logic hookup scrambling inside the DUT. Address scrambler 40 includes a multiplexer 100 controlled by data stored in a register 40 by host computer 24 of FIG. 1 via bus interface circuit 33. Multiplexer 100 routes selected bits of the output counts of counter logic 38 to address terminals of a RAM 102 during the test. Host computer 24 of FIG. 1 writes data into RAM 102 before the test, and during the test RAM 102 reads out that data when addressed by the output of multiplexer 100.

Data Generator

Figure 9:
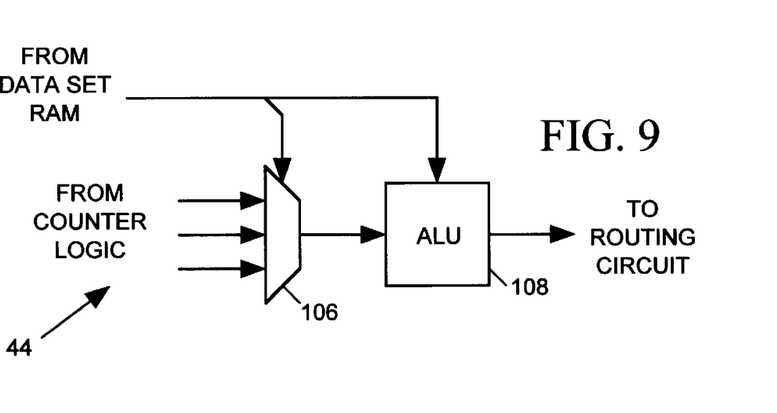
FIG. 9 illustrates the data generator of FIG. 2 in more detailed block diagram form.

FIG. 9 illustrates data generator 44 of FIG. 2 in more detailed block diagram form. (Data generator 64 of FIG. 2 is similar.) Data generator 44 a multiplexer 106 controlled by data from data set RAM 42 of FIG. 2. Multiplexer 106 routes selected bits of the output counts of counter logic 38 to input terminals of a conventional arithmetic logic unit (ALU) 108 also controlled by data from data set RAM 42 of FIG. 2. ALU 108 carries out selected arithmetic operations on its input data to produce output pattern data supplied to routing circuit 30.

Instruction Processing

All three pattern generators PG1–PG3 process a similar set of instructions in a similar manner. Referring to pattern generator PG1 of FIG. 2 as an example, program memory 32 stores at each address all of the information needed to tell PG1 what to do for one cycle of the test. Thus each address in program memory 32 has the fields listed in Table I.

TABLE I

| Field | Purpose |
| --- | --- |
| Address | next program memory address |
| Routing | input data to route select RAM 36 |
| Dataset | input data to data set RAM 42 |

TABLE I-continued

| Field | Purpose |
| --- | --- |
| Data | input data to routing circuit 30 |
| Instruct | next cycle circuit instructions |
| Counter | instructions to counter logic 38 |

The address field provides next cycle circuit 34 with the address of next program memory location that it is to access. If the address field is 0, the next cycle circuit simply increments the current address. The address field is a default address that is overridden if an instruction in the instruct field tells the next cycle circuit 34 to access some other address. The routing field is decoded by route select RAM 36 and indicates which input data routing circuit 30 is to route to the DUT. The dataset field is decoded by data set RAM 42 and indicates how data generator 44 is to process the output counts of counter logic 38 to provide input data to routing circuit 30. The data field contains any PSET, TSET, FSET or PG data that routing circuit 30 is to forward to the DUT. The instruct field contains one or more instructions for next cycle circuit 34 which executes the instruction in the order encountered. Table II lists the next cycle instruction set:

TABLE II

| Instruction | Function |
| --- | --- |
| noop | no operation |
| brad=<x> | branch address |
| branch | unconditional branch |
| call | unconditional call |
| return | unconditional return |
| loop=<x> | repeat loop <x> times |
| endloop | end of loop |
| branchcond=<x> | branch condition |
| branchf | branch on conditional fail |
| branchx | conditional branch on counter x = [cond] |
| branchy | conditional branch on counter y = [cond] |
| branchz | conditional branch on counter z = [cond] |
| callx | conditional call on counter x = [cond] |
| cally | conditional call on counter y = [cond] |
| callz | conditional call on counter z = [cond] |
| retx | conditional return on counter x = [cond] |
| rety | conditional return on counter y = [cond] |
| retz | conditional return on counter z = [cond] |
| stop | end of program |

The noop instructions indicates that the counter logic is to take no action. The brad instruction contains a branch address <x> to which the next cycle circuit 34 is to jump in response to any subsequent branch or call instruction. The branch instruction tells next cycle circuit 34 to branch unconditionally to the branch address. The call instruction tells next cycle circuit 34 to call a subroutine at the branch address. The return instructions tells the next cycle circuit to unconditionally return from a call. The loop instruction tells the next cycle circuit to execute a next set of instructions <x> times. The endloop instruction marks the end of a loop. The branch f tells the next cycle circuit 34 to branch if the DUT fails. The branchcond instruction contains a number that is the condition tested by all subsequent conditional instructions. The branchx, branchy, branchz, callx, cally, callz, retx, rety and retz instructions tell the next cycle circuit to branch or call to the branch address or to return from a call, if the x, y, or z count output of counter logic 38 matches the condition indicated by the last branch cond instruction. Branch conditions may include x equals y; x equals z; y equals z; or x, y or z equal a register value. The stop instruction marks the end of a program and tells the next cycle circuit to transmit an interrupt to the host computer via bus interface circuit 33 and to await a start command from interface circuit 33.

The counter field of the data stored at each address of program memory 32 includes a separate instruction for each of the x, y and z counters in logic 38. The counter instructions are listed in Table III.

TABLE III

| Instruction | Function |
|---|---|
| decrx | decrement counter x |
| incrx | increment counter x |
| holdx | hold current value of counter x |
| loadx=<x> | load counter x with value <x> |
| decry | decrement counter y |
| incry | increment counter y |
| holdy | hold current value of counter y |
| loady=<x> | load counter y with value <x> |
| decrz | decrement counter z |
| incrz | increment counter z |
| holdz | hold current value of counter z |
| loadz=<x> | load counter z with value <x> |

Program Example

The following programming example illustrates how to program PG1 to perform a simple error capture mode test of a RAM having 1024 storage locations. In this test a logical "0" is written into and read back out of all bit positions of all RAM storage locations. A logical "1" is then written into all and read back out of all bit positions of all RAM storage locations. The current read or write address is generated by counter X within counter logic 38, reordered as necessary by address scrambler 40 and then passed to routing circuit 30. Routing circuit 30 forwards each bit of the address as a PG data bit to a test channel supplying that bit to the address terminals of the DUT. Routing circuit 30 also forwards appropriate PSET, TSET and FSET from program memory 32 to each tester channel. Pattern generator PG3 stores the FAIL data produced by the tester channel in pattern memory PM3.

The program for PG1 stored in program memory 32 is listed in Table IV.

TABLE IV

| Addr | Field | Contents |
|---|---|---|
| 0 | address | 1 |
|  | routing | 1 |
|  | dataset | empty |
|  | data | PSET |
|  | instruct | branchcond=<1024>, brad=<5> |
|  | counter | loadx=<0>, holdy, holdz |
| 1 | address | 2 |
|  | routing | 1 |
|  | dataset | empty |
|  | data | (write "0") |
|  | instruct | branchx |
|  | counter | holdx, holdy, holdz |
| 2 | address | 3 |
|  | routing | a |
|  | dataset | empty |
|  | data | (read, compare to "0") |
|  | instruct | noop |
|  | counter | holdx, holdy, holdz |
| 3 | address | 4 |
|  | routing | 1 |
|  | dataset | empty |

TABLE IV-continued

| Addr | Field | Contents |
|---|---|---|
|  | data | (write "1") |
|  | instruct | noop |
|  | counter | holdx, holdy, holdz |
| 4 | address | 1 |
|  | routing | 1 |
|  | dataset | empty |
|  | data | (read, compare to "1") |
|  | instruct | noop |
|  | counter | incrx, holdy, holdz |
| 5 | address | 1 |
|  | routing | 1 |
|  | dataset | empty |
|  | data | (read current RAM address, compare to "1") |
|  | instruct | stop |
|  | counter | holdx, holdy, holdz |

At address 0 the address field tells next cycle logic to obtain its next instructions from program memory address 1. The routing field, providing an address input to source select RAM 36, references RAM 36 address 1 which contains the routing control data needed to set up routing circuit 30 to appropriately route PSET, TEST, FSET and PG values from the program memory (PM) data field and the address output of address scrambler 40 to the various tester channels for the first test cycle. The dataset field at PM address 0 is empty because the data generator 44 is not being used. The data field contains a PSET value. The instruct field includes a branchcond instruction setting the branch condition to 1024 and a brad instruction setting the branch address to 5. The counter field contains a loadx instruction setting counter x to 0 and holdy and holdz instructions telling counters y and z to hold their counts.

At address 1 the address field tells next cycle logic to obtain its next instructions from program memory address 2. The routing field continues to reference RAM 36 address 1 and the dataset field is empty. The data field includes the appropriate TSET and FSET information to tell the tester to write a "0" to the current memory address. The instruct field includes a branchx instruction telling the next cycle circuit to branch to the branch address (5) if the output of counter X is equal to the branch condition (1024). The counter field contains holdx, holdy and holdz instructions telling counters x, y and z to hold their counts.

At address 2 the address field tells next cycle logic to obtain its next instructions from program memory address 3. The routing field continues to reference RAM 36 address 1 and the dataset field is empty. The data field includes the appropriate TSET and FSET information to tell the tester to read from the current memory address and to generate a fail signal if any read bit is not a "0". The instruct field includes a noop instruction and the counter field contains holdx, holdy and holdz instructions telling counters x, y and z to hold their current counts.

At address 3 the address field tells next cycle logic to obtain its next instructions from program memory address 4. The routing field continues to reference RAM 36 address 1 and the dataset field is empty. The data field includes the appropriate TSET and FSET information to tell the tester to write a "1" to the current memory address. The instruct field includes a noop instruction and the counter field contains holdx, holdy and holdz instructions.

At address 4 the address field tells next cycle logic to obtain its next instructions from program memory address 1. The routing field continues to reference RAM 36 address 1, the dataset field is empty. The data field includes the appropriate TSET and FSET information to tell the tester to read from the current memory address and to generate a FAIL signal if any read bit is not a "1". The instruct field contains a noop instruction and the counter field contains incrx, holdy and holdz instructions. The incrx instruction tells counter X to increase its count.

At address 5, the instruction field contains the STOP address. Next cycle circuit 34 continues to loop though program addresses 1–4 until the counter X output count reaches 1024. At that point the test is complete and the program conditionally branches to address 5. Next cycle circuit 34 then awaits a start command from the host before reading out the instructions at address 0.

Program memory 52 of PG3 is addressed by the address (ADDR) output of next cycle circuit 34 of PG1 and also contains program instructions at addresses 0–5 as illustrated in Table V.

TABLE V

| Addr | Field | Contents |
|---|---|---|
| 0 | address | empty |
|   | routing | 1 |
|   | dataset | empty |
|   | data | empty |
|   | instruct | empty |
|   | counter | loadx=<0>, holdy, holdz |
| 1 | address | empty |
|   | routing | 1 |
|   | dataset | empty |
|   | data | (write) |
|   | instruct | empty |
|   | counter | holdx, holdy, holdz |
| 2 | address | empty |
|   | routing | 1 |
|   | dataset | empty |
|   | data | (write) |
|   | instruct | empty |
|   | counter | holdx, holdy, holdz |
| 3 | address | empty |
|   | routing | 1 |
|   | dataset | empty |
|   | data | (read) |
|   | instruct | empty |
|   | counter | holdx, holdy, holdz |
| 4 | address | empty |
|   | routing | 1 |
|   | dataset | empty |
|   | data | (write) |
|   | instruct | empty |
|   | counter | incrx, holdy, holdz |
| 5 | address | 1 |
|   | routing | 1 |
|   | dataset | empty |
|   | data | (write) |
|   | instruct | empty |
|   | counter | holdx, holdy, holdz |

The address and instruction fields at all address 0–5 of program memory 52 are empty because program memory addressing is being provided by next cycle circuit 34. Next cycle circuit 54 does not need instructions. The dataset field at all addresses is empty because data generator 64 is unused for this test. The routing field at each address is set to a 1 to address storage location 1 of route select RAM 56. This causes route select RAM 56 to produced routing control data causing address scrambler 60 to rearrange counter supply addresses to pattern memory PM3. The address scrambler 60 processes the count X output of counter logic 58 in the same way that address scrambler 40 processes the count X output of counter logic 38 so that pattern memory PM3 and the RAM under test are correspondingly addressed.

At address 0 the counter field contains a loadx instruction setting counter x to 0 and holdy and holdz instructions telling counters y and z to hold their counts. The data field is empty since no pattern memory read or write access is required.

At address 1 the counter field contains holdx, holdy and holdz instructions telling counters y and z to hold their counts. The data field remains empty because no pattern memory access is required while the tester is writing a "0" to the current RAM DUT address.

At address 2 the counter field continues to contain holdx, holdy and holdz instructions but the data field contains instructions to read/write controller 70 causing it to set up pattern memory PM3 for a write operation. At this point in the program, the tester is reading data out of the current RAM DUT address to determine if the RAM DUT is returning a 0 at each bit location, and returning FAIL data indicating the result. As fail processor 72 receives and processes the FAIL data, the processed FAIL data passes through routing circuit 50 to data input terminals of pattern memory PM3 and is stored at the current pattern memory address.

At address 3 the data field is empty because no pattern memory access is required while the tester is writing the logical "1" data bits to the current DUT RAM address.

At address 4 the data field contains instructions to read/write controller 70 causing it to set up pattern memory PM3 for a read/modify/write operation. At this point in the test the tester is reading data out of the current RAM address to determine if the RAM DUT is returning a logical "1" at each output bit location and generating the resulting FAIL data. As fail processor 72 receives and processes the FAIL data from the tester channels, it XOR that processed fail data with the data read out of pattern memory PM3. The result is then written back into the current pattern memory address. Thus each bit of data stored at the current pattern memory address indicates whether a corresponding RAM DUT cell failed to read back properly for either "0" phase or the "1" phase of the test. The counter field includes an incrx instruction so that the X count output of counter logic 58 is incremented.

At address 5, the data field is empty, and the counter field includes the holdx, holdy, holdz instructions.

While the forgoing specification has described preferred embodiment(s) of the present invention, one skilled in the art may make many modifications to the preferred embodiment without departing from the invention in its broader aspects. For example, the instruction set for the next cycle circuits could be expanded to provide more complex programming capability. The appended claims therefore are intended to cover all such modifications as fall within the true scope and spirit of the invention.

What is claimed is:

1. A parallel processing pattern generation system comprising:

a first pattern generator for storing and executing a first algorithm for generating first pattern data and first routing control data;

a second pattern generator for generating second pattern data by executing a second stored algorithm;

a first pattern memory addressed by said second pattern data and reading out stored third pattern data in response thereto; and     first routing means having input terminals and output terminals, said first routing means receiving said first pattern data and said third pattern data at its input terminals and delivering data appearing at selected ones of said input terminals to said output terminals in response to said first routing control data thereby to produce an output data pattern.

2. The parallel processing pattern generation system in accordance with claim 1 further comprising:
a third pattern generator for algorithmically generating fourth pattern data in response to a third stored algorithm; and
a second pattern memory addressed by said fourth pattern data and reading out stored fifth pattern data in response thereto, said firth pattern data being applied to input terminals of said first routing means.

3. The parallel processing pattern generating system in accordance with claim 1 wherein said first stored algorithm comprises a first sequence of first opcodes and first operands and wherein said first pattern generator comprises:
a first instruction memory for storing and reading out said first sequence of first opcodes and first operands in response to an input first sequence of addresses, wherein said first operands include said first routing control data for controlling said first routing means and include a first portion of said first pattern data; and
first next cycle means for receiving said first opcodes and for generating said first sequence of addresses in response to said first opcodes.

4. The parallel processing pattern generation system in accordance with claim 3 wherein said first pattern generator further comprises:
first counter means for incrementing and decrementing a first output count in response to said first operands; and
first address scrambler means for decoding said first output count to produce a second portion of said first pattern data applied to said input terminals of said first routing means.

5. The parallel processing pattern generation system in accordance with claim 4 wherein said first pattern generator further comprises first data generation means for performing logical operations on said first output count thereby to produce a third portion of said first pattern data provided as input to said first routing means.

6. The parallel processing pattern generation system in accordance with claim 5 wherein said first data generation means selects arithmetic operations to be performed in response to said first operands.

7. The parallel processing pattern generating system in accordance with claim 3 wherein said second stored algorithm comprises a second sequence of second opcodes and second operands and wherein said second pattern generator comprises:
a second instruction memory for storing and reading out said second opcodes and second operands in response to an input second sequence of addresses, wherein said second operands include a first portion of said second pattern data;
second next cycle means for receiving said second opcodes and for generating a third sequence of addresses in response to said second opcodes; and
multiplexing means for selectively delivering one of said first sequence of addresses and said third sequence of addresses as said input second sequence of addresses to said second instruction memory.

8. The parallel processing pattern generation system in accordance with claim 7
wherein said first pattern generator further comprises:
first counter means for incrementing and decrementing a first output count in response to said first operands;
first address scrambler means for decoding each value of said first output count to produce a second portion of said first pattern data applied to said input terminals of said first routing means; and
first data generation means for performing arithmetic operations on said first output count thereby to produce a third portion of said first pattern data provided as input to said first routing means, and
wherein said second instruction memory also reads out second routing control data and said second pattern generator further comprises:
second routing means having input terminals and output terminals, said second routing means receiving said fourth pattern data at its input terminals and delivering data appearing at selected ones of its input terminals to its output terminals in response to said second routing control data thereby to produce said second pattern data,
second counter means for incrementing and decrementing a second output count in response to said second operands;
second address scrambler means for decoding each value of said second output count to produce a first portion of said fourth pattern data applied to said input terminals of said second routing means; and
second data generation means for performing arithmetic operations on said second output count thereby to produce a second portion of said second pattern data provided as input to said second routing means.

9. The parallel processing pattern generation system in accordance with claim 7 wherein said first next cycle means generates a first address of said first sequence of addresses in response to an input first START signal and wherein said second next cycle means generates a first address of said second sequence of addresses in response to an input second START signal.

10. The parallel processing pattern generation system in accordance with claim 3 wherein said first next cycle means generates a first address of said first sequence of addresses in response to an input first START signal.

11. An apparatus for testing a circuit device under test (DUT) comprising:
tester means for responding to input pattern data by generating and transmitting test signals to the DUT and generating result data indicating whether DUT output signals produced in response to the test signals are of expected states, wherein the input pattern data indicates nature and timing of the transmitted test signals and the expected states of the DUT output signals;
a first pattern generator for storing and executing a first algorithm for generating first pattern data and first routing control data;
a second pattern generator for generating second pattern data and second routing control data by executing a second stored algorithm;
second routing means having input terminals and output terminals, said second routing means receiving said second pattern data and said result data at its input terminals and delivering data appearing at selected ones of its input terminals to its output terminals in response to said second routing control data, thereby to produce third pattern data;
a first pattern memory for receiving said third pattern data, for selectively reading out stored fourth pattern data in response to said third pattern data or storing third pattern data derived from said result data; and first routing means having input terminals and output terminals, said first routing means receiving said first pattern data and said fourth pattern data at its input terminals and delivering data appearing at selected ones of said input terminals to said output terminals in response to said first routing control data thereby to produce said input pattern data to said tester means.

12. The apparatus in accordance with claim 11 further comprising first analyzer means for reading the third pattern data derived from said result data out of said first pattern memory and analyzing the data it reads to produce information about said DUT.

13. The apparatus in accordance with claim 11 further comprising:
   a third pattern generator for generating fifth pattern data and third routing control data by executing a third stored algorithm;
   third routing means having input terminals and output terminals, said third routing means receiving said fifth pattern data and said result data at its input terminals and delivering data appearing at selected ones of its input terminals to its output terminals in response to said third routing control data, thereby to produce a sixth data pattern; and
   a second pattern memory for receiving said sixth pattern data, for selectively reading out stored 7th pattern data in response to said sixth pattern data or storing sixth pattern data derived from said result data.

14. The apparatus in accordance with claim 13 further comprising:
   first analyzer means for reading the third pattern data derived from said result data out of said first pattern memory and analyzing the data it reads to produce information about said DUT; and
   second analyzer means for reading the sixth pattern data derived from said result data out of said second pattern memory and analyzing the data it reads to produce information about said DUT.

15. The parallel processing pattern generating system in accordance with claim 14 wherein said second stored algorithm comprises a second sequence of second opcodes and second operands and wherein said second pattern generator comprises:
   a second instruction memory for storing and reading out said second opcodes and second operands in response to an input second sequence of addresses, wherein said second operands include a first portion of said second pattern data;
   second next cycle means for receiving said second opcodes and for generating a third sequence of addresses in response to said second opcodes; and
   multiplexing means for selectively delivering one of said fist sequence of addresses and said third sequence of addresses as said input second sequence of addresses to said second instruction memory.

16. The parallel processing pattern generation system in accordance with claim 15
   wherein said first pattern generator further comprises:
      first counter means for incrementing and decrementing a first output count in response to said first operands;
      first address scrambler means for decoding each value of said first output count to produce a second portion of said first pattern data applied to said input terminals of said first routing means; and
      first data generation means for performing arithmetic operations on said first output count thereby to produce a third portion of said first pattern data provided as input to said first routing means, and
   wherein said second instruction memory also reads out second routing control data and said second pattern generator further comprises:
      second routing means having input terminals and output terminals, said second routing means receiving said fourth pattern data at its input terminals and delivering data appearing at selected ones of its input terminals to selected ones of its output terminals in response to said second routing control data thereby to produce said second pattern data,
      second counter means for incrementing and decrementing a second output count in response to said second operands;
      second address scrambler means for decoding each value of said second output count to produce a first portion of said fourth pattern data applied to said input terminals of said second routing means; and
      second data generation means for performing arithmetic operations on said second output count thereby to produce a second portion of said second pattern data provided as input to said second routing means.

17. The apparatus in accordance with claim 11 wherein said first stored algorithm comprises a first sequence of first opcodes and first operands and wherein said first pattern generator comprises:
   a first instruction memory for storing and reading out said first sequence of first opcodes and first operands in response to an input first sequence of addresses, wherein said first operands include said first routing control data for controlling said first routing means and include a first portion of said first pattern data; and
   first next cycle means for receiving said first opcodes and for generating said first sequence of addresses in response to said first opcodes.

18. The parallel processing pattern generation system in accordance with claim 17 wherein said first pattern generator further comprises:
   first counter means for incrementing and decrementing a first output count in response to said first operands; and
   first address scrambler means for decoding said first output count to produce a second portion of said first pattern data applied to said input terminals of said first routing means.

19. The parallel processing pattern generation system in accordance with claim 18 wherein said first pattern generator further comprises first data generation means for performing logical operations on said first output count thereby to produce a third portion of said first pattern data provided as input to said first routing means.

20. The parallel processing pattern generation system in accordance with claim 19 wherein said first data generation means selects arithmetic operations to be performed in response to said first operands.

* * * * *